US008624759B2

(12) United States Patent
Maenpaa et al.

(10) Patent No.: US 8,624,759 B2
(45) Date of Patent: Jan. 7, 2014

(54) APPARATUS AND METHOD FOR AN ACTUATOR IN AN ELECTRONIC DEVICE

(75) Inventors: Jani Christian Maenpaa, Helsinki (FI); Dimitrios Dimaras, Espoo (FI)

(73) Assignee: Nokia Corporation, Espoo (FI)

( * ) Notice: Subject to any disclaimer, the term of this patent is extended or adjusted under 35 U.S.C. 154(b) by 567 days.

(21) Appl. No.: 12/783,464

(22) Filed: May 19, 2010

(65) Prior Publication Data
US 2011/0285553 A1 Nov. 24, 2011

(51) Int. Cl.
*H03M 11/00* (2006.01)

(52) U.S. Cl.
USPC .................. 341/33; 341/22; 341/34; 345/157; 345/174

(58) Field of Classification Search
USPC ..................... 341/22, 33, 34; 345/157–174
See application file for complete search history.

(56) References Cited

U.S. PATENT DOCUMENTS

| 4,758,830 | A | 7/1988 | Levien et al. ................. 345/174 |
| 6,271,830 | B1 | 8/2001 | Berstis |
| 6,370,965 | B1 * | 4/2002 | Knapp ...................... 73/862.046 |
| 6,530,283 | B2 * | 3/2003 | Okada et al. .................... 73/780 |
| 6,820,494 | B2 * | 11/2004 | Morimoto ........................ 73/780 |
| 6,867,601 | B2 * | 3/2005 | Morimoto ..................... 324/661 |
| 6,958,614 | B2 * | 10/2005 | Morimoto ..................... 324/661 |
| 7,324,091 | B2 | 1/2008 | Fyke |
| 7,372,281 | B2 * | 5/2008 | Morimoto ..................... 324/661 |
| 7,602,376 | B1 | 10/2009 | Hetherington ................ 345/161 |
| 2004/0080216 | A1 * | 4/2004 | Morimoto ..................... 307/125 |
| 2006/0220499 | A1 * | 10/2006 | Ikehashi ........................ 310/348 |
| 2008/0018611 | A1 * | 1/2008 | Serban et al. ................. 345/173 |
| 2008/0122945 | A1 | 5/2008 | Ahonen ..................... 348/223.1 |
| 2009/0031809 | A1 | 2/2009 | Lin et al. .................... 73/514.32 |
| 2009/0058802 | A1 * | 3/2009 | Orsley ........................... 345/157 |

FOREIGN PATENT DOCUMENTS

| EP | 1469494 A2 | 10/2004 |
| EP | 0838776 B1 | 8/2006 |
| EP | 1843373 A1 | 10/2007 |
| KR | 20080064260 A | 7/2008 |

* cited by examiner

*Primary Examiner* — Linh Nguyen
(74) *Attorney, Agent, or Firm* — Harrington & Smith

(57) ABSTRACT

In accordance with an example embodiment of the present invention, an apparatus is provided, comprising: a base element; a key top configured to pivot in relation to the base element; a first electrode coupled with the key top; a second electrode coupled with the base element; an isolating layer; the key top having a first pivoted position in which the first electrode, the second electrode, and the isolating layer form a capacitor with a first capacitance, and a second pivoted position in which the first electrode, the second electrode, and the isolating layer form a capacitor with a second capacitance.

19 Claims, 8 Drawing Sheets

APPARATUS AND METHOD FOR AN ACTUATOR IN AN ELECTRONIC DEVICE

TECHNICAL FIELD

The present application relates generally to an apparatus and method for an actuator in electronic device.

BACKGROUND

An electronic device typically comprises a variety of user interface components that enable users to interact with the electronic device. User interface components in portable electronic devices need to fulfill several requirements, such as compactness, suitability for mass manufacturing, durability, and ease of use. Increase of computing power of portable devices is turning them into versatile portable computers, which can be used for multiple different purposes. Therefore versatile user interface components are needed in order to take full advantage of capabilities of mobile devices.

Navigation keys are a type of user interface component used in many mobile devices. A navigation key may be a multi-way key which is adapted for entering information that relates to directions. The user can indicate different directions, such as up, down, left, or right, by pressing different parts of a navigation key. Directional information may be linked to various user interface operations, such a scrolling, navigation, or moving a cursor.

SUMMARY

Various aspects of examples of the invention are set out in the claims.

As in a first aspect of the present invention, an apparatus is provided, comprising: a base element; a key top configured to pivot in relation to the base element; a first electrode coupled with the key top; a second electrode coupled with the base element; an isolating layer; the key top having a first pivoted position in which the first electrode, the second electrode, and the isolating layer form a capacitor with a first capacitance, and a second pivoted position in which the first electrode, the second electrode, and the isolating layer form a capacitor with a second capacitance.

As in a second aspect of the present invention, an electronic device is provided, comprising: a base element; a key top configured to pivot in relation to the base element; a first electrode coupled with the key top; a second electrode coupled with the base element; an isolating layer; the key top having a first pivoted position in which the first electrode, the second electrode, and the isolating layer form a capacitor with a first capacitance, and a second pivoted position in which the first electrode, the second electrode, and the isolating layer form a capacitor with a second capacitance.

As in a third aspect of the present invention, a method is provided, comprising: providing a base element; providing a key top; coupling a first electrode to the key top and coupling a second electrode to the base element; providing an isolating layer; configuring the key top to pivot in relation to the base; and configuring the key top to have a first pivoted position in which the first electrode, the second electrode, and the isolating layer form a capacitor with a first capacitance, and a second pivoted position in which the first electrode, the second electrode, and the isolating layer form a capacitor with a second capacitance.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

An example embodiment of the present invention and its potential advantages are understood by referring to FIGS. 1 through 8 of the drawings.

Figure 1:
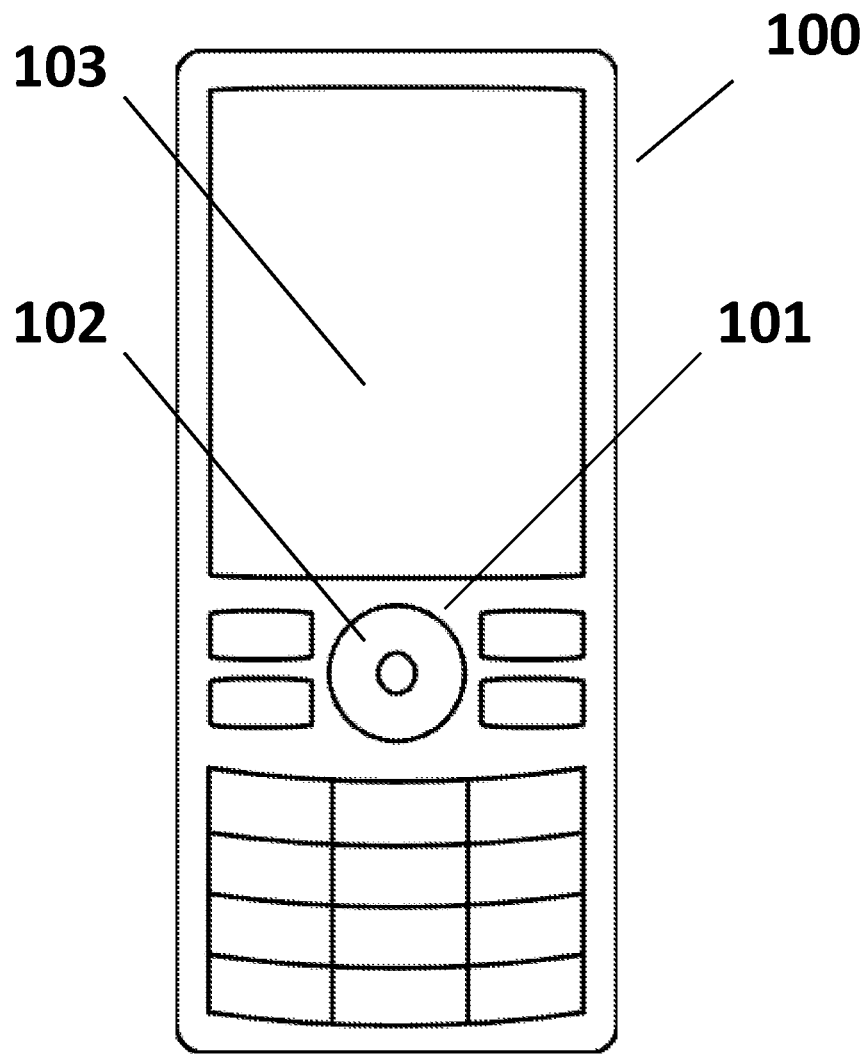
FIG. 1 is a diagram illustrating an electronic device comprising a navigation key according to an example embodiment of the invention.

FIG. 1 is a diagram illustrating an electronic device 100 comprising a navigation key 101 according to an example embodiment of the invention. In an embodiment, the navigation key comprises a key top 102, which has an external surface accessible for the user and configured for being pressed with a finger or any other suitable object. According to FIG. 1, the electronic device 100 is illustrated as a mobile telephone. However, a navigation key 101 according to aspects of the invention may be provided in many other electronic devices without departing from the spirit of the invention. By way of example, the electronic device 100 may be an audio player, a multimedia device, a gaming device, a navigation device, a portable computer, an electronic book reader, and/or another type of electronic device. In an embodiment, the external surface of the key top 102 has a flat circular shape. In an embodiment, the key top 102 is located proximate to a display 103 of the electronic device 100. However, any suitable shape and location is possible without departing from the spirit of the invention.

Figure 2:
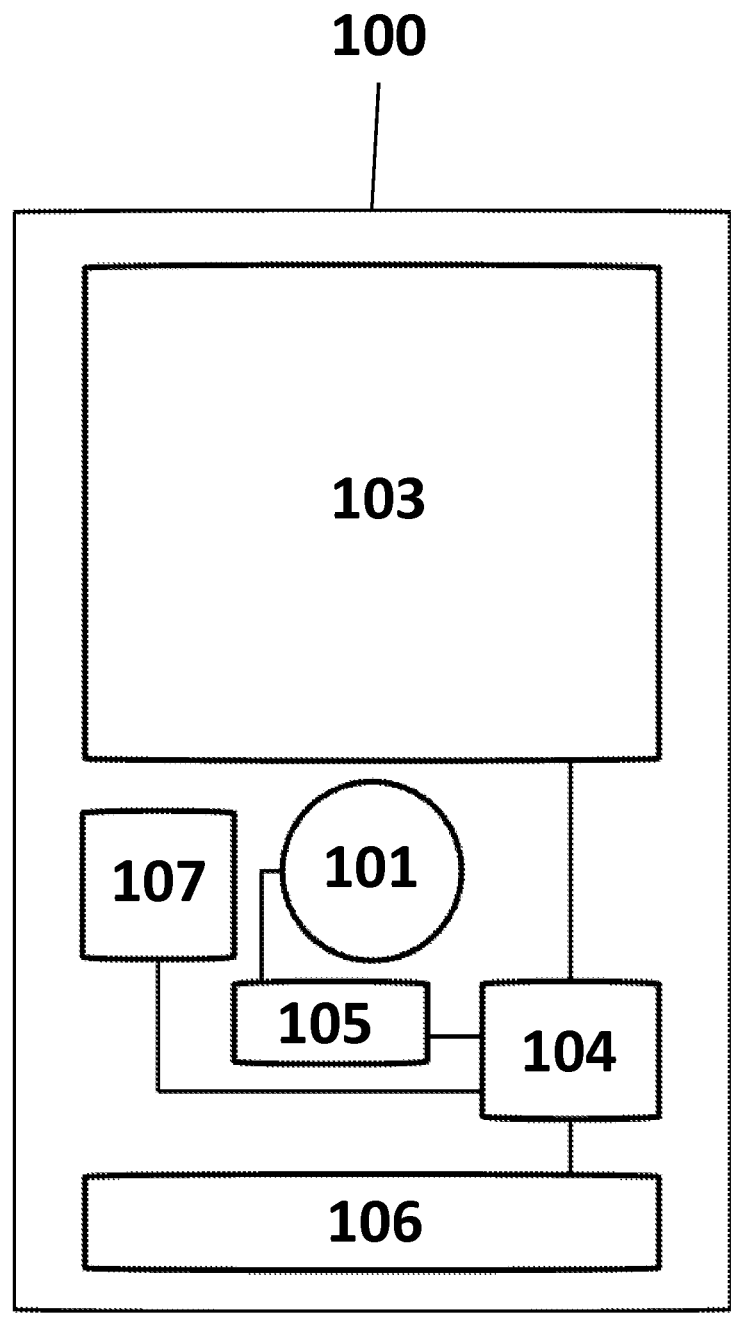
FIG. 2 is a block diagram illustrating an electronic device comprising a navigation key according to an example embodiment of the invention.

FIG. 2 is a block diagram illustrating an electronic device 100 comprising a navigation key 101 according to an example embodiment of the invention. In an embodiment, the electronic device 100 comprises a display 103 and a processor 104. In an embodiment, the navigation key 101 is a capacitive key, and the electronic device 100 comprises a capacitance sensing element 105 configured to measure a capacitance from the navigation key 101. In an embodiment, the electronic device comprises a power source 106, a memory 107, and/or other other elements and components.

Figure 3:
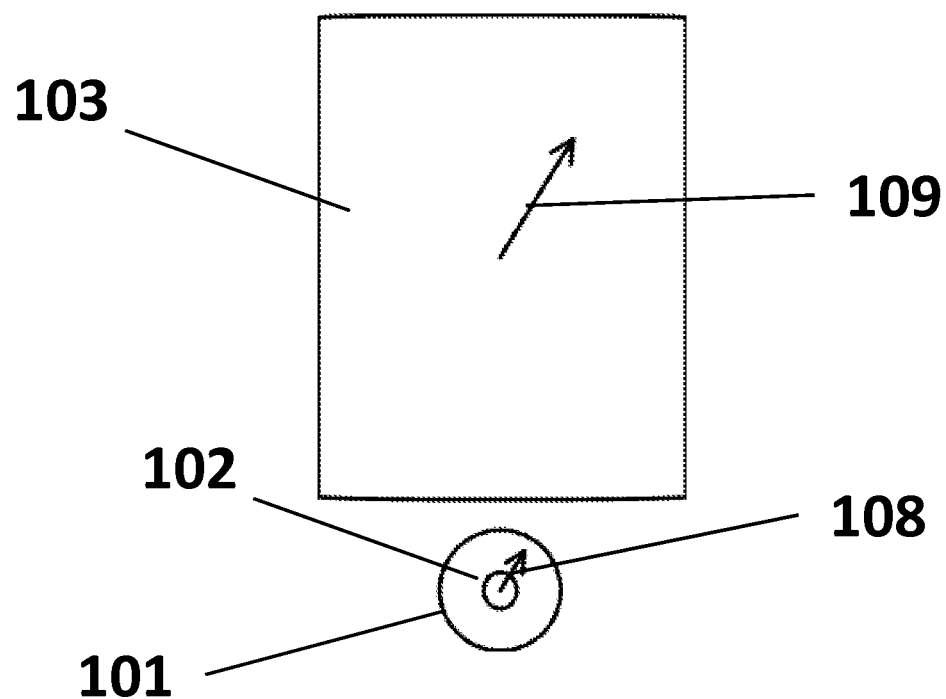
FIG. 3 is a diagram illustrating operation of an electronic device according to an example embodiment of the invention.

FIG. 3 is a diagram illustrating operation of an apparatus according to an example embodiment of the invention. FIG. 3 illustrates a key top 102 of a navigation key 101 and a display 103. In an embodiment, the electronic device 100 of FIG. 1 comprises the display 103 and the navigation key 101. In an embodiment, the navigation key 101 is configured for recognizing a direction indicated by a user. The user may indicate a direction by pressing a location on the key top with a finger or a suitable object. The location is indicated in FIG. 3 with a position vector 108, which is a vector indicating the location in relation to the center point of the key top 102. The direction of the position vector 108 may be interpreted as the direction indicated by the user. In an embodiment, a continuum of directions in a two-dimensional space is recognized. In an embodiment, a continuum of directions is a finely divided set of a plurality of discrete directions. In an embodiment, any direction within the plane of the electronic device 100 is recognized.

In an embodiment, the navigation key 101 is configured for recognizing different magnitudes of force acting on the key top 102. In an embodiment, the navigation key 101 is a capacitive key, and its capacitance is configured to vary in response to a force acting on the key top 102. In an embodiment, if the capacitance of the navigation key 101 is a first capacitance, lower than a predetermined threshold capacitance, the force acting on the key top 102 is interpreted as low. In an embodiment, if the capacitance of the navigation key 101 is a second capacitance, higher than a predetermined threshold capacitance, the force is interpreted as high. However, more than two levels of force may be recognized without departing from the spirit of the invention.

The electronic device 100 of FIG. 1 may be configured to perform an operation in response to actuation of the navigation key 101. In an embodiment, the electronic device is configured to perform a first function in response to detecting the first capacitance. In an embodiment, the electronic device is configured to perform a second function in response to detecting the second capacitance. In an embodiment, the function is movement of a cursor in the direction indicated by the user. The movement is illustrated with a vector 109 in FIG. 3. In an embodiment, the operation may be scrolling or navigation in a content item, such as a map or a photograph, according to the direction indicated by the user. Many other operations are possible without departing from the spirit of the invention. In an embodiment, the electronic device 100 of FIG. 1 is configured to carry out the operation in different ways depending on the force acting on the key top 102. In an embodiment, if the first capacitance is detected, the operation such as movement, scrolling, or navigation is carried out at a first speed. In an embodiment, if the second capacitance is detected, the operation such as movement, scrolling, or navigation is carried out at a second speed. In an embodiment, the second speed is higher than the first speed. More than two levels of speed may be recognized without departing from the spirit of the invention.

Figure 4A:
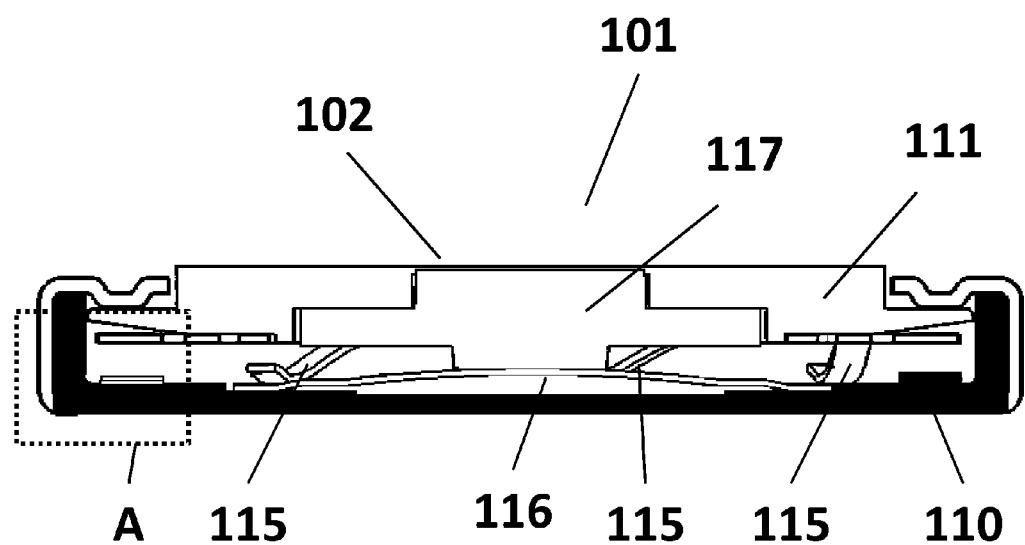
FIG. 4a is a diagram illustrating a neutral position of an apparatus according to an example embodiment of the invention.
Figure 4B:
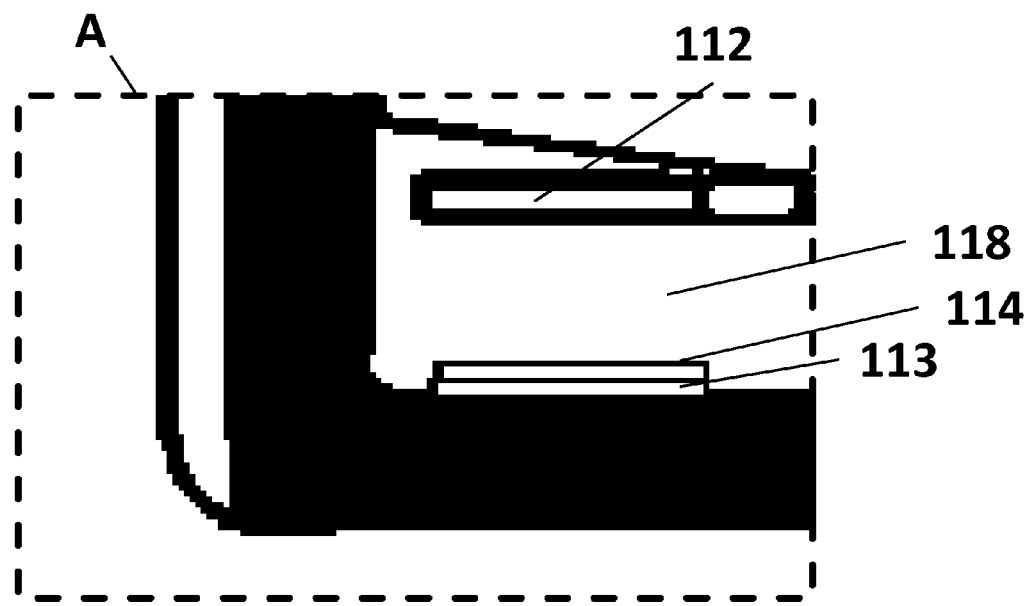
FIG. 4b is an enlarged view of region A in FIG. 4a illustrating a neutral position of an apparatus according to an example embodiment of the invention.

FIG. 4a is a diagram illustrating a neutral position of an apparatus according to an example embodiment of the invention. FIG. 4b is an enlarged view of region A in FIG. 4a illustrating a neutral position of an apparatus according to an example embodiment of the invention. Reference is now made to both FIGS. 4a and 4b.

FIG. 4a illustrates a navigation key 101. In an embodiment, the navigation key 101 comprises a base element 110 and a key top 102. In an embodiment, the key top 102 comprises a peripheral part 111. In an embodiment, a first electrode 112 of FIG. 4b is coupled with the key top 102. In an embodiment, the first electrode 112 of FIG. 4b is coupled with the peripheral part 111 of the key top 102. In an embodiment, a second electrode 113 of FIG. 4b is disposed on the base element 110. In an embodiment, an isolating layer 114 of FIG. 4b is disposed between the first electrode 112 of FIG. 4b and the second electrode 113 of FIG. 4b. In an embodiment, the isolating layer 114 of FIG. 4b is a layer of a suitable dielectric material configured to prevent galvanic contact between the first electrode 112 of FIG. 4b and the second electrode 113 of FIG. 4b. In an embodiment, the isolating layer 114 of FIG. 4b is disposed on the second electrode 113 of FIG. 4b. However, the isolating layer 114 of FIG. 4b may be disposed on the first electrode 112 of FIG. 4b, without departing from the spirit of the invention. Different locations and configurations of the first electrode 112 of FIG. 4b, the second electrode 113 of FIG. 4b, and the isolating layer 114 of FIG. 4b are possible without departing from the spirit of the invention. In the neutral position, an air gap 118 of FIG. 4b exists at least between the first electrode 112 of FIG. 4b and the isolating layer 114 of FIG. 4b, or the second electrode 113 of FIG. 4b and the isolating layer 114 of FIG. 4b. In an embodiment, the first electrode 112 of FIG. 4b, is not in contact with the isolating layer 114 of FIG. 4b in the neutral position. In an embodiment, the second electrode 113 of FIG. 4b, is not in contact with the isolating layer 114 of FIG. 4b in the neutral position.

The navigation key 101 further comprises one or more resilient members 115, configured to bias the key top 102 to the neutral position. In FIG. 4a, the resilient members 115 are illustrated as torsion springs. However, other types of resilient members 115 are possible without departing from the spirit of the invention. The navigation key 101 further comprises a switch element 116 disposed between the base element 110 and the key top 102. The switch element 116 is configured to be actuated when a sufficient force, having a component perpendicular to the key top 102, acts on a location proximate to the center of the key top 102. In an embodiment, the key top 102 comprises a center part 117, configured to be movable for actuating the switch element 116, without necessarily moving the peripheral part 111.

Figure 5A:
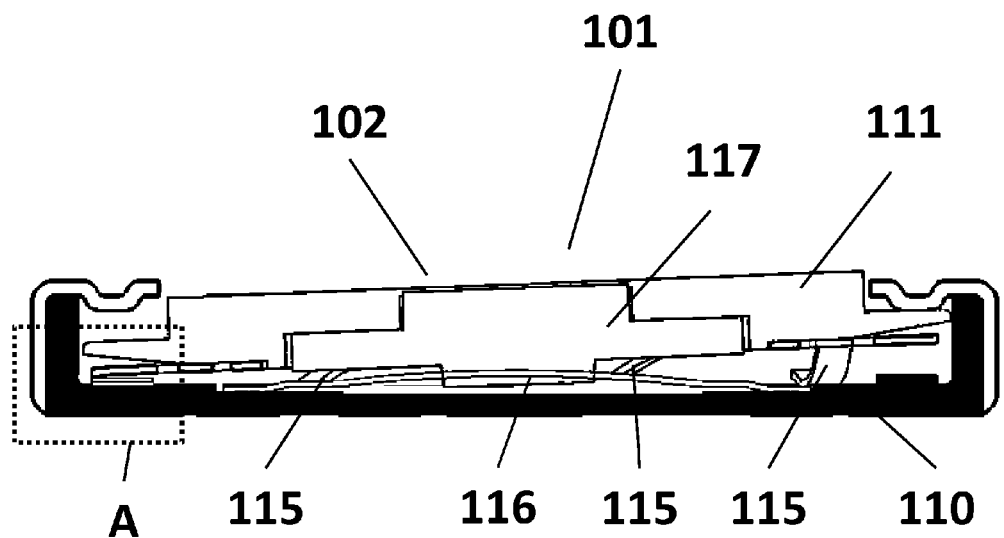
FIG. 5a is a diagram illustrating a first pivoted position of an apparatus according to an example embodiment of the invention.
Figure 5B:
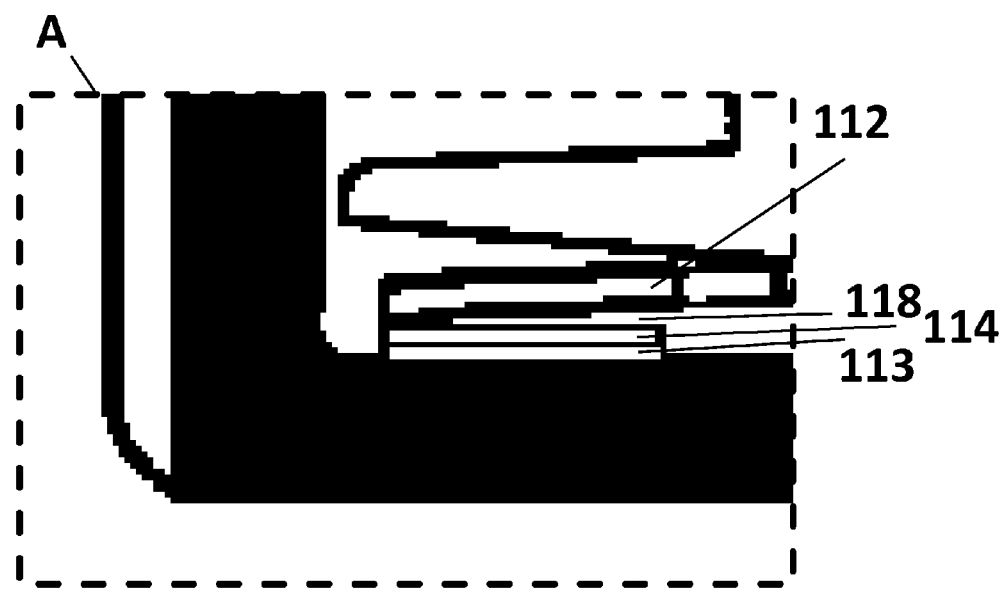
FIG. 5b is an enlarged view of region A in FIG. 5a illustrating a first pivoted position of an apparatus according to an example embodiment of the invention.

FIG. 5a is a diagram illustrating a first pivoted position of an apparatus according to an example embodiment of the invention. FIG. 5b is an enlarged view of region A in FIG. 5a illustrating a first pivoted position of an apparatus according to an example embodiment of the invention. Reference is now made to both FIGS. 5a and 5b.

FIG. 5a illustrates a navigation key 101 such as in FIGS. 4a and 4b. In the first pivoted position, the key top 102 is inclined with respect to the base element 110 in such a way that the first electrode 112 of FIG. 5b, the second electrode 113 of FIG. 5b, and the isolating layer 114 of FIG. 5b are in at least partial contact with each other and form a capacitor with a first capacitance. In an embodiment, an air gap 118 of FIG. 5b exists between a portion of the first electrode 112 of FIG. 5b and the isolating layer 114 of FIG. 5b, or a portion of the second electrode 113 of FIG. 5b and the isolating layer 114 of FIG. 5b. One of the first electrode 112 of FIG. 5b and the second electrode 113 of FIG. 5b may be configured to undergo a resilient deformation in order to take the shape of the first pivoted position.

Figure 6A:
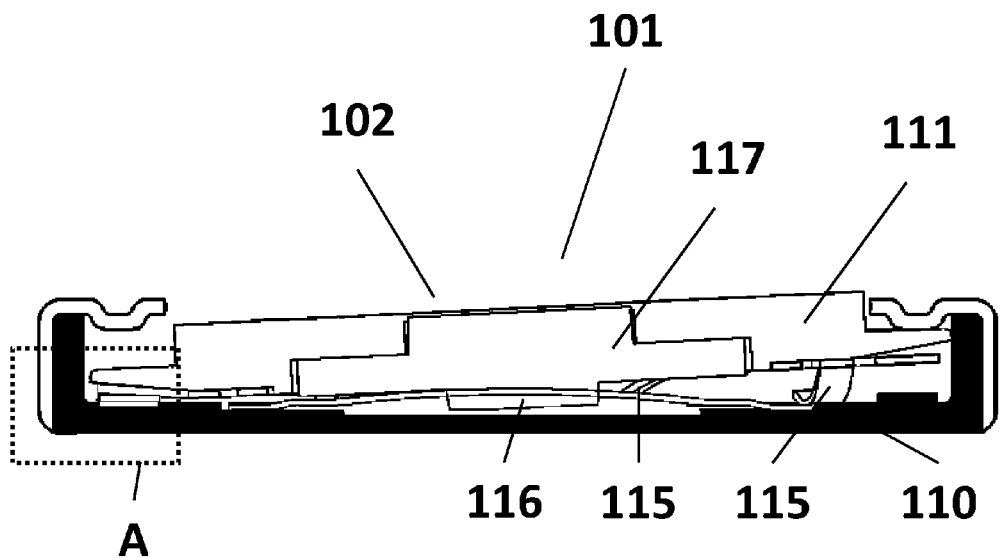
FIG. 6a is a diagram illustrating a second pivoted position of an apparatus according to an example embodiment of the invention.
Figure 6B:
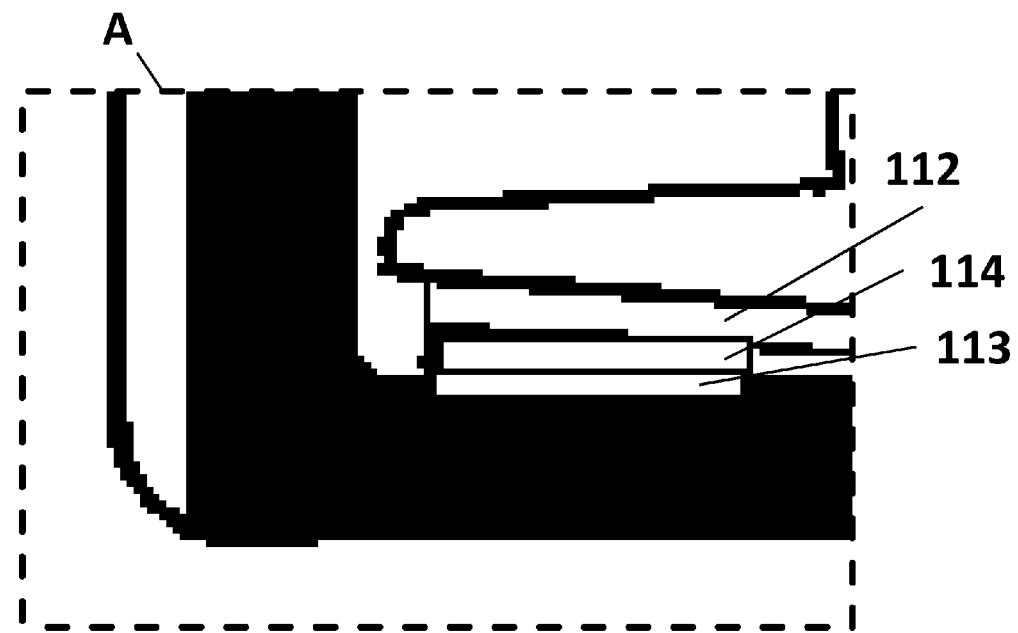
FIG. 6b is an enlarged view of region A in FIG. 6a illustrating a second pivoted position of an apparatus according to an example embodiment of the invention.

FIG. 6a is a diagram illustrating a second pivoted position of an apparatus according to an example embodiment of the invention. FIG. 6b is an enlarged view of region A in FIG. 6a illustrating a second pivoted position of an apparatus according to an example embodiment of the invention. Reference is now made to both FIGS. 6a and 6b.

FIG. 6a illustrates a navigation key 101 such as in FIG. 4a, 4b, 5a or 5b. In the second pivoted position, the key top 102 is inclined with respect to the base element 110 in such a way that the first electrode 112 of FIG. 6b, the second electrode 113 of FIG. 6b, and the isolating layer 114 of FIG. 6b are in at least partial contact with each other and form a capacitor with a second capacitance. In an embodiment, substantially no air gap exists between the first electrode 112 of FIG. 6b and the isolating layer 114 of FIG. 6b, or the second electrode 113 of FIG. 6b and the isolating layer 114 of FIG. 6b. At least one of the first electrode 112 of FIG. 6b and the second electrode 113 of FIG. 6b may be configured to undergo a resilient deformation in order to take the shape of the second pivoted position.

Reference is now made to FIGS. 5a, 5b, 6a, and 6b. In an embodiment, the navigation key 101 is configured to take the first pivoted position illustrated in FIGS. 5a and 5b as a result of a force acting on the peripheral part 111 of the key top 102, the force having a magnitude lower than a predetermined threshold magnitude. In an embodiment, the navigation key 101 is configured to take the second pivoted position illustrated in FIGS. 6a and 6b as a result of a force acting on the peripheral part 111 of the key top 102, the force having a magnitude higher than a predetermined threshold magnitude. In an embodiment, a capacitor comprising the first electrode 112, the second electrode 113 and the isolating layer 114 in the second pivoted position has a higher active surface area than in the first pivoted position. In an embodiment, an air gap between the first electrode 112 and the isolating layer 114, or the second electrode 113 and the isolating layer 114 is diminished in the second pivoted position compared with the first pivoted position. In an embodiment, the capacitor comprising the first electrode 112, the second electrode 113 and the isolating layer 114 in the first pivoted position has a first capacitance, lower than a predetermined threshold capacitance. In an embodiment, the capacitor comprising the first electrode 112, the second electrode 113 and the isolating layer 114 in the second pivoted position has a second capacitance, higher than a predetermined threshold capacitance. The predermined threshold capacitance may correspond to the predetermined threshold magnitude of force.

Reference is now made to FIGS. 1, 2, and 3 in connection with FIGS. 5a, 5b, 6a, and 6b. Consider a force acting on the key top 102 at a location indicated by the position vector 108 in FIG. 3, the magnitude of the force being lower than a predetermined threshold magnitude. The force may result from a user pressing the key top 102 with a finger or a suitable object. As a result, the navigation key 101 may take the first pivoted position such as in FIGS. 5a and 5b, the first electrode 112, the second electrode 113 and the isolating layer 114 forming a capacitor with a first capacitance. Consider further a force acting on the key top 102 at a location indicated by the position vector 108 in FIG. 3, the magnitude of the force being higher than a predetermined threshold magnitude. The force may result from a user pressing the key top 102 with a finger or a suitable object. As a result, the navigation key 101 may take the second pivoted position such as in FIGS. 6a and 6b, the first electrode 112, the second electrode 113 and the isolating layer 114 forming a capacitor with a second capacitance. In an embodiment, the first capacitance is identified with a low force acting on the key top 102, and the second capacitance is identified with a high force acting on the key top 102. In an embodiment, the capacitance sensing element 105 of FIG. 2 is configured to sense the capacitance of the capacitor comprising the first electrode 112, the second electrode 113 and the isolating layer 114. The processor 104 of FIG. 2 may be configured to cause the electronic device 100 of FIG. 1 to perform an operation, such as movement of a cursor, or scrolling a content item such as a map or a photograph at one of two speed levels, based on the capacitance sensed by the capacitance sensing element 105 of FIG. 2. More than two levels of capacitance may be recognized without departing from the spirit of the invention.

Figure 7:
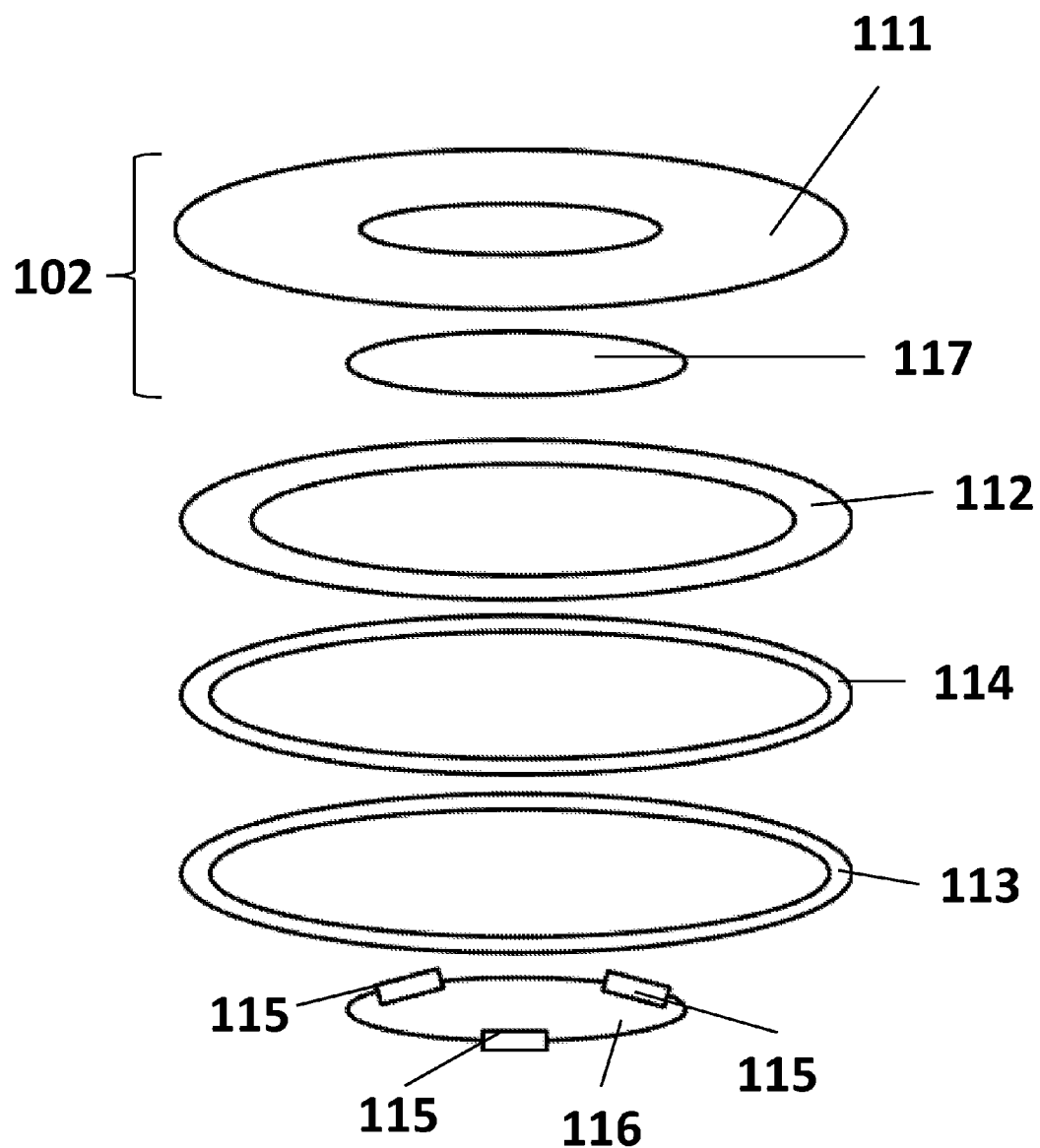
FIG. 7 is a diagram illustrating an apparatus according to an example embodiment of the invention.

FIG. 7 is a diagram illustrating an apparatus according to an example embodiment of the invention. The diagram may be a partial exploded perspective view of the apparatus of any of FIG. 4a, 4b, 5a, 5b, 6a, or 6b. In an embodiment, the apparatus comprises a key top 102, comprising a peripheral part 111 and a center part 117. In an embodiment, the apparatus further comprises a first electrode 112, a second electrode 113, and an isolating layer 114, the isolating layer 114 being located generally between the first electrode 112 and the second electrode 113. In an embodiment, the apparatus further comprises a switch element 116, which is a dome switch or any other type of switching element. In an embodiment, the apparatus further comprises a resilient member 115, which is a torsion spring or any other type of spring or resilient element. A plurality of resilient members 115 may be provided.

Figure 8:
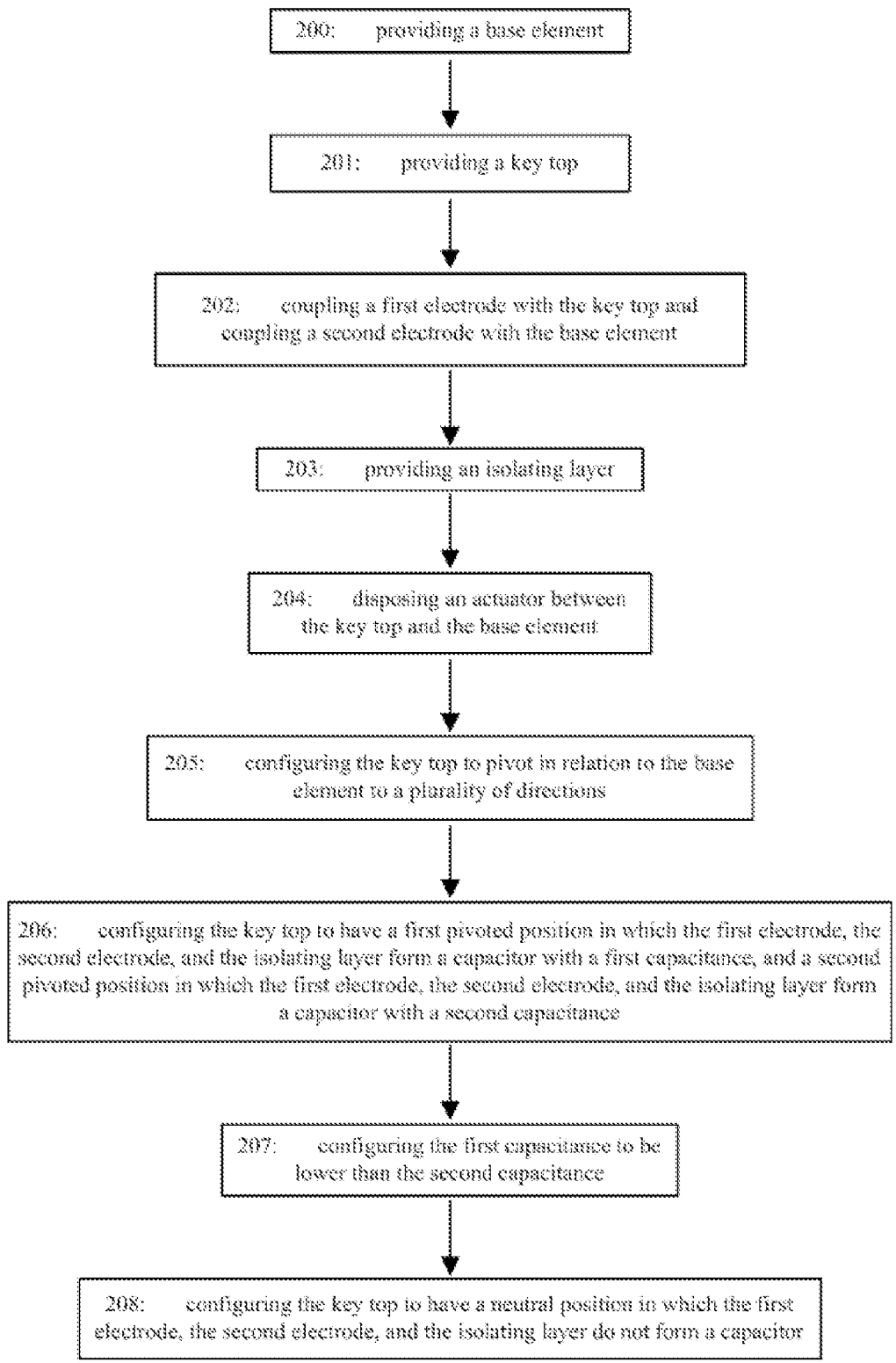
FIG. 8 is a flow diagram illustrating a method according to an example embodiment of the invention.

FIG. 8 is a flow chart describing a method according to an example embodiment of the invention. In an embodiment, the method is a manufacturing method for a navigation key according to embodiments of the invention. At 200, a base element 110 of FIG. 4a, 5a, or 6a is provided. At 201, a key top 102 of FIG. 4a, 5a, or 6a is provided. At 202, a first electrode 112 of FIG. 4a, 5a, or 6a is coupled with the key top 102 and a second electrode 113 of FIG. 4a, 5a, or 6a is coupled with the base element 110. At 203, an isolating layer 114 of FIG. 4a, 5a, or 6a is provided. The isolating layer may be connected to the first electrode 112 or the second electrode 113. At 204, a switch element 116 of FIG. 4a, 5a, or 6a is disposed between the base element 110 and the key top 102. At 205, the key top 102 is configured to pivot in relation to the base element 110 to a plurality of directions. At 206, the key top 102 is configured to have a first pivoted position in which the first electrode 112, the second electrode 113, and the isolating layer 114 form a capacitor with a first capacitance, and a second pivoted position in which the first electrode 112, the second electrode 113, and the isolating layer 114 form a capacitor with a second capacitance. At 207, the first capacitance is configured to be lower than the second capacitance. At 208, the key top 102 is configured to have a neutral position in which the first electrode 112, the second electrode 113, and the isolating layer 114 do not form a capacitor.

Without in any way limiting the scope, interpretation, or application of the claims appearing below, a technical effect of one or more of the example embodiments disclosed herein is that a navigation key for an electronic device is provided. Another technical effect of one or more of the example embodiments disclosed herein is that a navigation key capable of recognizing a continuum or plurality of directions in two-dimensional space is provided. Another technical effect of one or more of the example embodiments disclosed herein is that a navigation key capable of recognizing different magnitudes of force is provided. Another technical effect of one or more of the example embodiments disclosed herein is that the navigation key is compact and suitable for being produced with mass manufacturing methods. Another technical effect of one or more of the example embodiments disclosed herein is flexible navigation of large content items is made possible.

Embodiments of the present invention may be implemented in software, hardware, application logic or a combination of software, hardware and application logic. The software, application logic and/or hardware may reside on the electronic device 100 of FIG. 1. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted in FIG. 2. A computer-readable medium may comprise a computer-readable storage medium that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus, comprising:
a base element;
a key top configured to pivot in relation to the base element;
a first electrode coupled with the key top;
a second electrode coupled with the base element; and
an isolating layer;
the key top having a first pivoted position in which the first electrode, the second electrode, and the isolating layer form a capacitor with a first capacitance, and a second pivoted position in which the first electrode, the second electrode, and the isolating layer form a capacitor with a second capacitance, wherein the key top has a neutral position in which one of the first electrode and the second electrode are not in contact with the isolating layer, and wherein at least one of the first electrode and the second electrode is configured to undergo a resilient deformation in order to take the shape of the second pivoted position such that substantially no air gap exists between the first electrode and the isolating layer.

2. An apparatus as in claim 1, wherein the first capacitance is lower than the second capacitance.

3. An apparatus as in claim 1, wherein the isolating layer is disposed on the second electrode.

4. An apparatus as in claim 1, the key top comprising a peripheral part, wherein the first electrode is coupled with the peripheral part.

5. An apparatus as in claim 1, further comprising a resilient member configured to bias the key top toward the neutral position.

6. An apparatus as in claim 1, wherein the isolating layer and one of the first electrode and the second electrode define an air gap, the air gap configured to vary in size as a result of the deformation.

7. An apparatus as in claim 1, wherein the key top is configured to pivot in relation to the base element to a plurality of directions.

8. An apparatus as in claim 1, the key top comprising a center part, wherein a switch element is disposed between the center part and the base element.

9. An apparatus as in claim 8, wherein the switch element is configured to be responsive to a force acting on the center part.

10. An electronic device comprising:
a base element;
a key top configured to pivot in relation to the base element;
a first electrode coupled with the key top;
a second electrode coupled with the base element;
an isolating layer;
the key top having a first pivoted position in which the first electrode, the second electrode, and the isolating layer form a capacitor with a first capacitance, and a second pivoted position in which the first electrode, the second electrode, and the isolating layer form a capacitor with a second capacitance, wherein the key top has a neutral position in which one of the first electrode and the second electrode are not in contact with the isolating layer, and wherein at least one of the first electrode and the second electrode is configured to undergo a resilient deformation in order to take the shape of the second pivoted position such that substantially no air gap exists between the first electrode and the isolating layer.

11. An electronic device as in claim 10, wherein the electronic device is configured to perform a first function in response to detecting the first capacitance.

12. An electronic device as in claim 11, wherein the first function is navigation at a first speed.

13. An electronic device as in claim 10, wherein the electronic device is configured to perform a second function in response to detecting the second capacitance.

14. An electronic device as in claim 13, wherein the second function is navigation at a second speed.

15. A method, comprising:
providing a base element;
providing a key top;
coupling a first electrode to the key top and coupling a second electrode to the base element;
providing an isolating layer;
configuring the key top to pivot in relation to the base;
configuring the key top to have a first pivoted position in which the first electrode, the second electrode, and the isolating layer form a capacitor with a first capacitance, and a second pivoted position in which the first electrode, the second electrode, and the isolating layer form a capacitor with a second capacitance, wherein at least one of the first electrode and the second electrode is configured to undergo a resilient deformation in order to take the shape of the second pivoted position such that substantially no air gap exists between the first electrode and the isolating layer; and
configuring the key top to have a neutral position in which one of the first electrode and the second electrode is not in contact with the isolating layer.

16. A method as in claim 15, further comprising:
configuring the first capacitance to be lower than the second capacitance.

17. A method as in claim 15, further comprising:
disposing a switch element between the key top and the base element.

18. An apparatus as in claim 1, wherein the isolating layer comprises a dielectric material.

19. An apparatus as in claim 1, wherein the isolating layer is configured to prevent galvanic contact between the first electrode and the second electrode.

* * * * *